United States Patent
Zhou et al.

(10) Patent No.: US 8,822,634 B2
(45) Date of Patent: Sep. 2, 2014

(54) COPOLYMER COMPRISING ANTHRACENE AND BENZOSELENADIAZOLE, PREPARING METHOD AND USES THEREOF

(75) Inventors: Mingjie Zhou, Shenzhen (CN); Jie Huang, Shenzhen (CN); Jiale Huang, Shenzhen (CN)

(73) Assignee: Ocean's King Lighting Science & Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 13/635,357

(22) PCT Filed: Apr. 23, 2010

(86) PCT No.: PCT/CN2010/072153
§ 371 (c)(1),
(2), (4) Date: Sep. 14, 2012

(87) PCT Pub. No.: WO2011/130922
PCT Pub. Date: Oct. 27, 2011

(65) Prior Publication Data
US 2013/0005933 A1 Jan. 3, 2013

(51) Int. Cl.
| | | |
|---|---|---|
| *C08G 59/00* | (2006.01) | |
| *C08G 65/00* | (2006.01) | |
| *C08G 79/08* | (2006.01) | |
| *C08G 61/12* | (2006.01) | |
| *C09B 69/10* | (2006.01) | |
| *H01L 51/00* | (2006.01) | |
| *H01L 51/50* | (2006.01) | |
| *H01L 51/42* | (2006.01) | |
| *H01L 51/05* | (2006.01) | |

(52) U.S. Cl.
CPC .......... *H01L 51/0043* (2013.01); *C08G 61/126* (2013.01); *C08G 2261/314* (2013.01); *C08G 2261/91* (2013.01); *C09B 69/101* (2013.01); *H01L 51/5012* (2013.01); *C08G 2261/124* (2013.01); *Y02E 10/549* (2013.01); *C08G 2261/1412* (2013.01); *C08G 2261/95* (2013.01); *H01L 51/4253* (2013.01); *H01L 51/0558* (2013.01); *C08G 2261/3223* (2013.01); *C09B 69/109* (2013.01); *C08G 2261/3247* (2013.01); *C08G 61/123* (2013.01); *C08G 2261/526* (2013.01); *H01L 51/0036* (2013.01); *C08G 2261/92* (2013.01)
USPC .............................................. 528/405; 528/8

(58) Field of Classification Search
USPC .................................................... 528/8, 405
See application file for complete search history.

(56) References Cited

U.S. PATENT DOCUMENTS

| | | | |
|---|---|---|---|
| 6,309,763 B1 * | 10/2001 | Woo et al. ...................... | 428/690 |
| 7,074,884 B2 * | 7/2006 | Towns et al. ................... | 528/394 |
| 2006/0052612 A1 * | 3/2006 | Stossel et al. ................. | 548/126 |
| 2006/0083945 A1 * | 4/2006 | Morishita et al. ............. | 428/690 |
| 2009/0036623 A1 * | 2/2009 | Tsuda et al. ................... | 526/242 |
| 2009/0048413 A1 * | 2/2009 | Oda et al. ........................... | 528/7 |
| 2010/0001263 A1 * | 1/2010 | Noguchi et al. ................. | 257/40 |
| 2010/0108993 A1 * | 5/2010 | Moriwaki et al. .............. | 257/40 |
| 2011/0127512 A1 * | 6/2011 | Goto et al. ........................ | 257/40 |
| 2011/0156018 A1 * | 6/2011 | Moriwaki et al. .............. | 257/40 |
| 2012/0156829 A1 * | 6/2012 | Chen et al. ........................ | 438/99 |
| 2012/0267574 A1 * | 10/2012 | Shiang et al. ............. | 252/301.35 |
| 2012/0312374 A1 * | 12/2012 | Zhou et al. ..................... | 136/263 |
| 2013/0005933 A1 * | 1/2013 | Zhou et al. ........................... | 528/8 |
| 2013/0090446 A1 * | 4/2013 | Zhou et al. ........................... | 528/8 |
| 2013/0225782 A1 * | 8/2013 | Zhou et al. ..................... | 528/205 |

FOREIGN PATENT DOCUMENTS

EP         2110400 A1 * 10/2009 ............. C09K 11/06

OTHER PUBLICATIONS

Chien et al. (Journal of Polymer Science: Part A: Polymer Chemistry, vol. 45, 2938-2946, 2007).*
Yang et al. (Marcomolecules 2003, 36, 7453-7460).*

* cited by examiner

Primary Examiner — Liam J Heincer (I)

(74) *Attorney, Agent, or Firm* — Shimokaji & Associates P.C.

(57) ABSTRACT

A copolymer comprising anthracene and benzoselenadiazole, preparing method and uses thereof are disclosed. The copolymer is represented by formula (I), wherein n is a natural number from 10 to 1000, a is 1 or 2, b is 0, 1 or 2, X, Y are O, S, Se, $SO_2$, N—$R_4$ or $R_5$—Si—$R_6$; $R_4$, $R_5$, $R_6$ are selected from $C_1$-$C_{20}$ straight-chain, branched-chain or cyclo alkyl or alkoxy; $R_1$, $R_2$ are unsubstituted, monosubstituted or polysubstituted functional group $Ar_1$, and said $Ar_1$ is selected from hydrogen, halogen, cyano, substituted or unsubstituted $C_1$-$C_{40}$ straight-chain or branched-chain or cyclo alkyl, substituted or unsubstituted aryl or heteroaryl; $R_3$, $R_7$ are unsubstituted, monosubstituted or polysubstituted functional group $Ar_2$, and said $Ar_2$ is selected from hydrogen, cyano, substituted or unsubstituted $C_1$-$C_{40}$ straight-chain or branched-chain or cyclo alkyl, substituted or unsubstituted $C_1$-$C_{40}$ alkoxy, substituted or unsubstituted $C_6$-$C_{40}$ aryl, substituted or unsubstituted $C_6$-$C_{40}$ aralkyl, substituted or unsubstituted $C_6$-$C_{40}$ aryl alkoxy.

11 Claims, 3 Drawing Sheets

(I)

COPOLYMER COMPRISING ANTHRACENE AND BENZOSELENADIAZOLE, PREPARING METHOD AND USES THEREOF

FIELD OF THE INVENTION

The invention refers to organic material technology field, especially to copolymer comprising anthracene and benzoselenadiazole, preparing method and uses thereof.

BACKGROUND OF THE INVENTION

Organic material has been the research focus, which popularly used in copolymer material at present. Researches and developments involved in it are increasing. As optoelectronic material or semiconductor material, copolymer material is becoming one of hotspots in the field of energy. A typical application is solar cell, for example.

Traditional solar cell with high efficiency use inorganic semiconductor as raw material normally, but commercial development of the main silicon wafers solar cell is repressed by complicated productive technology, heavy pollution, energy-wasting and high cost. Thus, it is the research focus and difficult in photovoltaic field to take advantage of low-priced material to produce low-cost solar cell with high efficiency. However, organic material is of good environmental stability, excellent suppleness, film-forming properties, low-cost, and easily controlled. On the other hand, the process of organic solar cell is relatively simple; it can be operated at low temperature. And the production cost of devices is also cheaper. Due to such advantages, organic material has attracted much attention to be cheap and attractive material of solar cell. Besides, the potential advantages of organic solar cell include the followings: it can be manufactured on a large scale, it can use flexible substrate, it has friendly relations with environment, and it is portable, etc.

Organic photovoltaic material has such advantages, like good thermal stability, easy to be processed, low cost. It can achieve specific photoelectric function by molecular design. Based on such advantages, organic photovoltaic material can be implemented in kinds of semiconductor or photoelectric devices. For example, copolymer solar cell is a kind of new solar cell, which uses organic material normally. Some advantages of copolymer solar cell cannot be matched by inorganic solar cell, such as extensive material source, diversity of controllable structure, low cost, safety, simple process, light quality and it can be flexibly manufactured on a large scale. Possessing important development and application prospects, it can be implemented in building construction, lighting, power generation and other fields. Nevertheless, efficiency of photon-to-electron conversion of copolymer solar cell is much lower than that of inorganic solar cell so far.

SUMMARY OF THE INVENTION

For that reason, a copolymer comprising anthracene and benzoselenadiazole with good stability which has wide wavelength range of spectrum response and a simple, low-cost preparing method of copolymer comprising anthracene and benzoselenadiazole are provided.

The uses of said copolymer comprising anthracene and benzoselenadiazole are also provided in the embodiments of the present invention.

A copolymer comprising anthracene and benzoselenadiazole which is represented by the following formula (I):

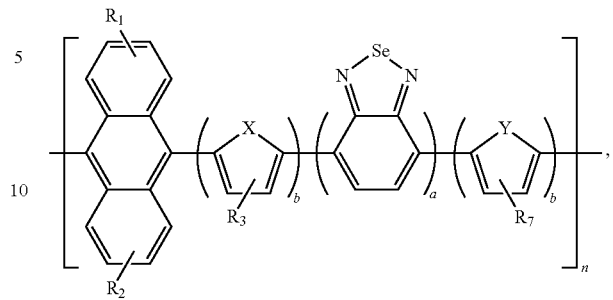

wherein n is a natural number from 10 to 1000, a is 1 or 2, b is 0, 1 or 2, X, Y are O, S, Se or $SO_2$, N—$R_4$, $R_5$—Si—$R_6$; $R_4$, $R_5$, $R_6$ are selected from $C_1$-$C_{20}$ straight-chain, branched-chain or cyclo alkyl or alkoxy; $R_1$, $R_2$ are unsubstituted, monosubstituted or polysubstituted functional group $Ar_1$, and said functional group $Ar_1$ is selected from hydrogen, halogen, cyano, substituted or unsubstituted $C_1$-$C_{40}$ straight-chain or branched-chain or cyclo alkyl, substituted or unsubstituted aryl or heteroaryl; $R_3$, $R_7$ are unsubstituted, monosubstituted or polysubstituted functional group $Ar_2$, and said functional group $Ar_2$ is selected from hydrogen, cyano, substituted or unsubstituted $C_1$-$C_{40}$ straight-chain or branched-chain or cyclo alkyl, substituted or unsubstituted $C_1$-$C_{40}$ alkoxy, substituted or unsubstituted $C_6$-$C_{40}$ aryl, substituted or unsubstituted $C_6$-$C_{40}$ aralkyl, substituted or unsubstituted $C_6$-$C_{40}$ aryl alkoxy.

A preparing method of a copolymer comprising anthracene and benzoselenadiazole, comprising:

providing compounds A and B represented by the following formula, respectively:

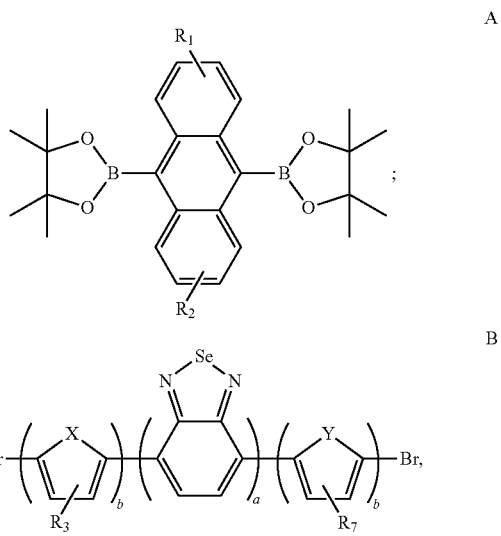

wherein a is 1 or 2; b is 0, 1 or 2; X, Y are O, S, Se or $SO_2$, N—$R_4$, $R_5$—Si—$R_6$; $R_4$, $R_5$, $R_6$ are selected from $C_1$-$C_{20}$ straight-chain, branched-chain or cyclo alkyl or alkoxy; $R_1$, $R_2$ are unsubstituted, monosubstituted or polysubstituted functional group $Ar_1$, and said functional group $Ar_1$ is selected from hydrogen, halogen, cyano, substituted or unsubstituted $C_1$-$C_{40}$ straight-chain or branched-chain or cyclo alkyl, substituted or unsubstituted aryl or heteroaryl;

$R_3$, $R_7$ are unsubstituted, monosubstituted or polysubstituted functional group $Ar_2$, and said functional group $Ar_2$ is selected from hydrogen, cyano, substituted or unsubstituted $C_1$-$C_{40}$ straight-chain or branched-chain or cyclo alkyl, substituted or unsubstituted $C_1$-$C_{40}$ alkoxy, substituted or unsubstituted $C_6$-$C_{40}$ aryl, substituted or unsubstituted $C_6$-$C_{40}$ aralkyl, substituted or unsubstituted $C_6$-$C_{40}$ aryl alkoxy;

Compound A and compound B were carried out in the presence of catalyst, alkaline solution and organic solvent and under oxygen-free environment, the polymerization represented by following formula:

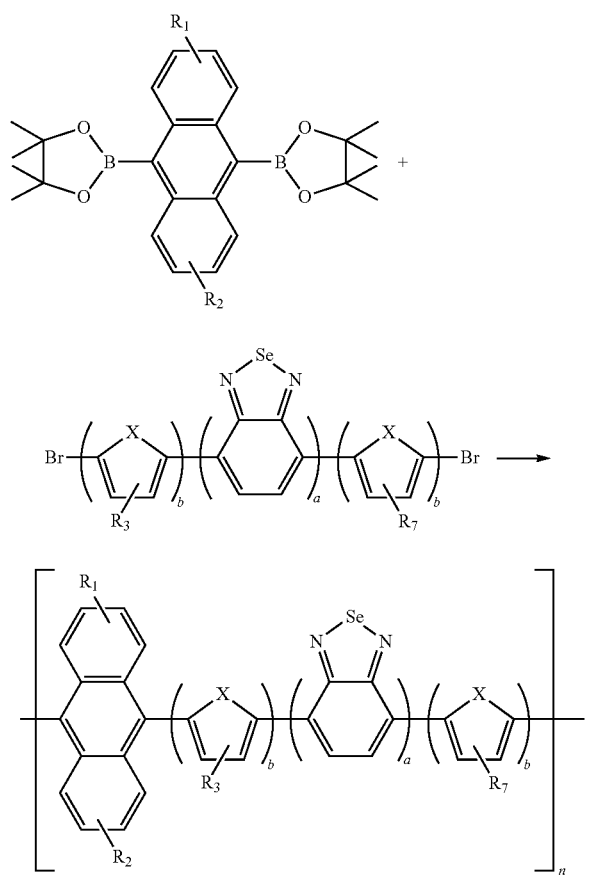

wherein n is a natural number from 10 to 1000, to produce said copolymer comprising anthracene and benzoselenadiazole.

Also, the uses of said copolymer comprising anthracene and benzoselenadiazole in organic optoelectronic materials, polymer solar cell devices, organic field effect transistors, organic light-emitting devices, organic optical storage devices, organic nonlinear materials or organic laser devices.

In said copolymer comprising anthracene and benzoselenadiazole, the stability and film-forming properties of polymer are improved by taking advantage of excellent stability and good film-forming properties of anthracene and its derivatives. Also, said copolymer comprising anthracene and benzoselenadiazole which is a kind of excellent organic semiconductor material, has appropriate carrier transport properties, the hole mobility of its crystal reaches 3 cm$^2$/V·s at room temperature. Moreover, because the atom radius of selenium (Se) is 103 pm which exceeds that of some heteroatoms such as sulfur (88 pm), it enhances the molecular overlap between the molecular chains, promotes charge hopping motion to endow copolymer comprising anthracene and benzoselenadiazole with higher carrier mobility. And, by the introduction of benzoselenadiazole unit into copolymer comprising anthracene and benzoselenadiazole, it has strong ability in electron transferring; also can increase backbone electron cloud density of the copolymer, narrow the band gap of the copolymer, broaden the absorption range of the copolymer to solar spectrum. In said preparing method of copolymer comprising anthracene and benzoselenadiazole, manufacturing costs can be reduced by synthesizing along relatively simple synthetic route. Based on the above advantages, said copolymer comprising anthracene and benzoselenadiazole can be implemented in said material or devices to improve the photoelectricity or semiconductor relative performance, reduce the weight of devices, and facilitate to manufacture on a large scale.

BRIEF DESCRIPTION OF THE DRAWINGS

Further description of the present invention will be illustrated, which combined with embodiments in the drawings.

DETAILED DESCRIPTION OF ILLUSTRATED EMBODIMENTS

Figure 1:
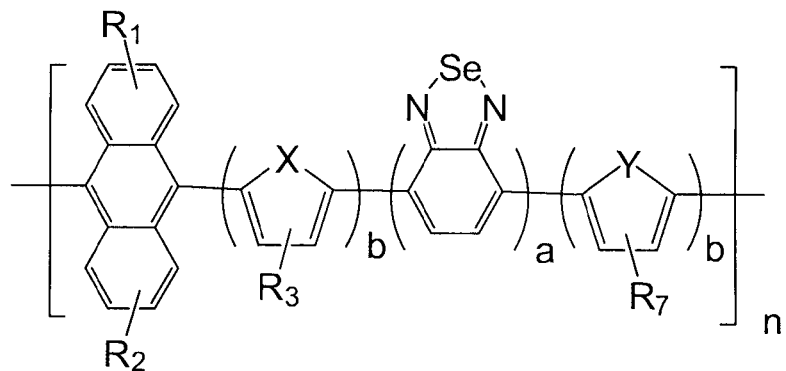
FIG. 1 shows the formula of copolymer comprising anthracene and benzoselenadiazole in the embodiments of the present invention.

Further description of the present invention will be illustrated, which combined with embodiments in the drawings, in order to make the purpose, the technical solution and the advantages clearer. While the present invention has been described with reference to particular embodiments, it will be understood that the embodiments are illustrative and that the invention scope is not so limited.

Referring to FIG. 1, a copolymer comprising anthracene and benzoselenadiazole are provided in the embodiments of the present invention, which is represented by the following formula (I):

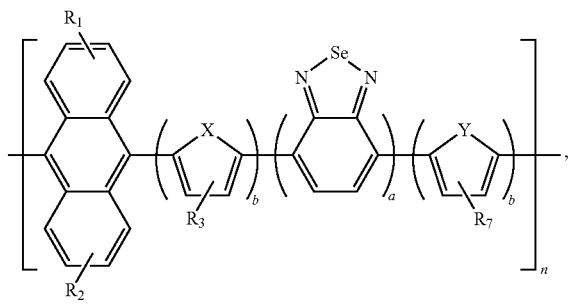

(I)

wherein n is a natural number from 10 to 1000, a is 1 or 2, b is 0, 1 or 2, X, Y are O, S, Se or $SO_2$, N—$R_4$, $R_5$—Si—$R_6$; $R_4$, $R_5$, $R_6$ are selected from $C_1$-$C_{20}$ straight-chain, branched-chain or cyclo alkyl or alkoxy; $R_1$, $R_2$ are unsubstituted, monosubstituted or polysubstituted functional group $Ar_1$, and said functional group $Ar_1$ is selected from hydrogen, halogen, cyano, substituted or unsubstituted $C_1$-$C_{40}$ straight-chain or branched-chain or cyclo alkyl, substituted or unsubstituted aryl or heteroaryl; $R_3$, $R_7$ are unsubstituted, monosubstituted or polysubstituted functional group $Ar_2$, and said functional group $Ar_2$ is selected from hydrogen, cyano, substituted or unsubstituted $C_1$-$C_{40}$ straight-chain or branched-chain or cyclo alkyl, substituted or unsubstituted $C_1$-$C_{40}$ alkoxy, substituted or unsubstituted $C_6$-$C_{40}$ aryl, substituted or unsubstituted $C_6$-$C_{40}$ aralkyl, substituted or unsubstituted $C_6$-$C_{40}$ aryl alkoxy.

Wherein, $R_1$ and $R_2$ are preferred chosen as the same functional group $Ar_1$ to enhance the molecule structure symmetry of copolymer. When b is not 0, each unit of copolymer contains at least a quinary heterocycle unit, and the heterocyclic atoms or groups are O, S, N, Si, Se or $SO_2$. All the units have quinary heterocyclic structure, which follows the Huckel rule, and have moderate band gap, wide wavelength range of spectrum response, good thermal and environmental stability. In an embodiment, when b is not 0, that is, b is 1 or 2, each unit of copolymer contains more said quinary heterocycle unit, which improves its performance. $R_4$, $R_5$, $R_6$ are selected from $C_1$-$C_{20}$ straight-chain, branched-chain or cyclo alkyl or alkoxy, which can be the alkyl chain or alkoxy chain with more carbon atoms such as alkyl or alkoxy with more than 6 carbon atoms ($C_6$). n is a natural number from 10 to 100.

X, Y can be the same or different, for example, X and Y are Se. Meanwhile, because the atom radius of selenium (Se) is 103 pm which exceeds that of some heteroatom such as sulfur (88 pm), it enhances the molecular overlap between the molecular chains, promotes charge hopping motion to endow copolymer comprising anthracene and benzoselenadiazole with higher carrier mobility. When X, Y is any one of N—$R_6$, Si—$R_7$—$R_8$, it is able to introduce alkyl or alkoxy into nitrogenous thiophene or silicon thiophene, resulting in improvement of the dissolved performance of material and the film processing performance, and enlargement of its application.

Functional group $Ar_1$ is preferred chosen as halogen, cyano, substituted or unsubstituted $C_1$-$C_{40}$ straight-chain or branched-chain or cyclo alkyl, substituted or unsubstituted aryl or heteroaryl. When functional group $Ar_1$ is halogen, cyano, aryl heteroaryl group and other electron-withdrawing groups, through the introduction of such group, it's favorable for improving the stability of material. On the other hand, due to the expansion of conjugated structure and improvement of molecule planar properties, it's favorable for narrowing the band gap of material so that the solar spectral absorption range of copolymer is more broadened, improving photon-to-electron conversion efficiency. When functional group $Ar_1$ is substituted or unsubstituted $C_1$-$C_{40}$ straight-chain or branched-chain or cyclo alkyl, substituted or unsubstituted aryl or heteroaryl, for one thing, through the introduction of alkyl or aryl or heteroaryl to improve the dissolved performance of material, it's favorable for film reforming process and enlargement of its application. When functional group $Ar_1$ is $C_1$-$C_{40}$ straight-chain or branched-chain or cyclo alkyl, alkyl with more than 18 carbon atoms ($C_{18}$) is preferred, for enhancement of the polymer molecular weight, getting better dissolved performance, and good for film reforming process.

Like functional group $Ar_1$, for improving the performance of copolymer, functional group $Ar_2$ is preferred chosen as cyano, substituted or unsubstituted $C_1$-$C_{40}$ straight-chain or branched-chain or cyclo alkyl, substituted or unsubstituted $C_1$-$C_{40}$ alkyl, substituted or unsubstituted $C_6$-$C_{40}$ aryl, substituted or unsubstituted $C_6$-$C_{40}$ aralkyl, substituted or unsubstituted $C_6$-$C_{40}$ aryl alkoxy.

Said unit of copolymer comprising anthracene and benzoselenadiazole may contain several thiophene rings and other quinary heterocycle units. Said structure unit endows the copolymer with moderate band gap, wide spectrum responding wavelength range which is around 300-700 nm, largely covering that of the visible light. It also has good thermal, environmental stability and shows good photoelectric properties.

Figure 2:
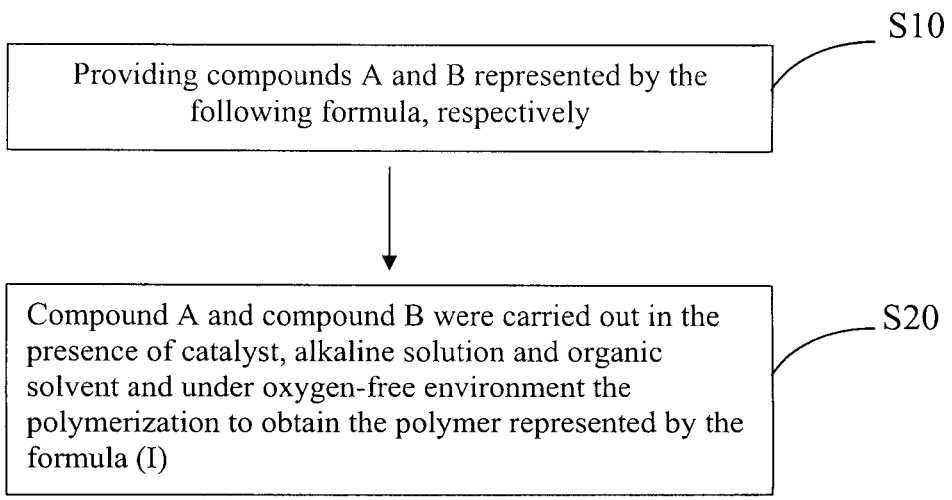
FIG. 2 shows the flow chart of the preparation method of copolymer comprising anthracene and benzoselenadiazole in the embodiments of the present invention.

Referring to FIG. 2, said preparing method of copolymer comprising anthracene and benzoselenadiazole, comprising:

S10: Providing compounds A and B represented by the following formula, respectively:

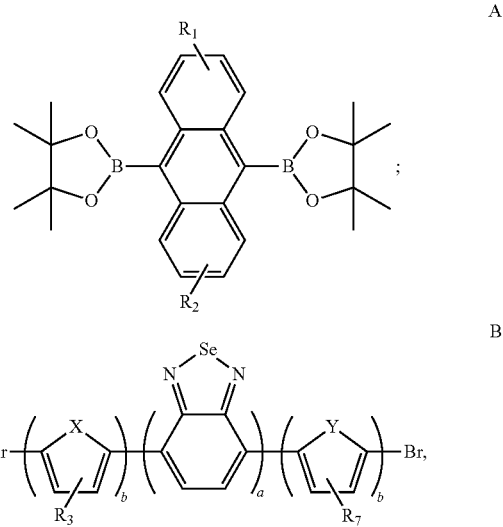

wherein a is 1 or 2, b is 0, 1 or 2, X, Y are O, S, Se or $SO_2$, N—$R_4$, $R_5$—Si—$R_6$. $R_4$, $R_5$, $R_6$ are selected from $C_1$-$C_{20}$ straight-chain, branched-chain or cyclo alkyl or alkoxy; $R_1$, $R_2$ are unsubstituted, monosubstituted or polysubstituted functional group $Ar_1$, and said functional group $Ar_1$ is selected from hydrogen, halogen, cyano, substituted or unsubstituted $C_1$-$C_{40}$ straight-chain or branched-chain or cyclo alkyl, substituted or unsubstituted aryl or heteroaryl; $R_3$, $R_7$ are unsubstituted, monosubstituted or polysubstituted functional group $Ar_2$, and said functional group $Ar_2$ is selected from hydrogen, cyano, substituted or unsubstituted $C_1$-$C_{40}$ straight-chain or branched-chain or cyclo alkyl, substituted or unsubstituted $C_1$-$C_{40}$ alkoxy, substituted or unsubstituted $C_6$-$C_{40}$ aryl, substituted or unsubstituted $C_6$-$C_{40}$ aralkyl, substituted or unsubstituted $C_6$-$C_{40}$ aryl alkoxy.

S20: Compound A and compound B were carried out in the presence of catalyst, alkaline solution and organic solvent and under oxygen-free environment, the polymerization represented by following formula:

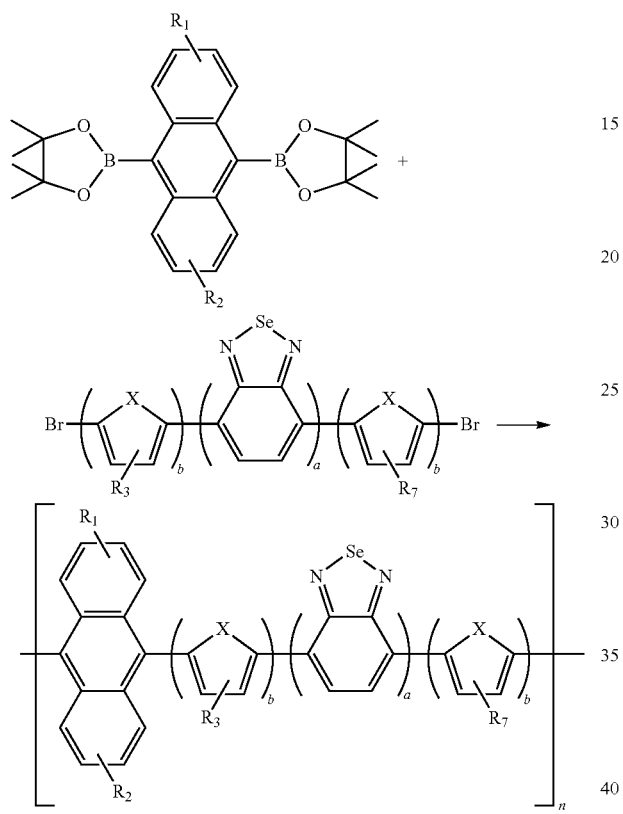

wherein n is a natural number from 10 to 1000, to produce said copolymer comprising anthracene and benzoselenadiazole.

In the step S10, compound A and B can be obtained by purchasing on the market or prepared through the existing synthesis methods, which is not discussed here. Wherein, each group in compound A and B is almost the same as the description of said copolymer comprising anthracene and benzoselenadiazole, which is not discussed here.

In the present embodiment, compound A and B are fresh made. Firstly, the specific preparation of compound A is described as follows:

In anhydrous oxygen-free reactor, under the continuous stirring and the protection of $N_2$, adding pale yellow crystal-like 9,10-dibromoanthracene (i.e. Compound A in the following equations.) and organic solvent, then adding n-BuLi under the temperature in the range of −78° C. to −25° C. The reaction system is gradually getting orange red from pale yellow, stirring for several hours. After the reaction, injecting 2-isopropoxy-4,4,5,5-tetramethyl-1,3,2-dioxaborolane under the temperature in the range of −78° C. to −25° C., the whole reaction system becomes pale yellow from orange red. When temperature rises to room temperature, conduct the reaction overnight (such as 12-14 hours). After the reaction, carry out the purification and separation which include the followings: adding saturated sodium chloride aqueous solution in reaction solution, extracting with chloroform, drying with anhydrous sodium sulfate. Collect the filtrate and rotary evaporate solvent after leaching. At last, separate the colature by column chromatography on silica gel column with petroleum ether-ethyl acetate used as eluent to get product compound A, and test products. Organic solvent can be weak polar or polar aprotic organic solvent or its mixed solvent, such as but not limited to tetrahydrofuran, ethanol, methanol, dichloromethane, trichloromethane, ethyl acetate, dimethyl formamide, methylbenzene or acetone, etc. Tetrahydrofuran is preferred. Anhydrous oxygen-free reactor is mainly under the protection atmosphere of nitrogen. Of course the reaction can be carried out under the protection of other inert gases such as neon, argon, but it is not limited to these. Specific equation is represented as follows:

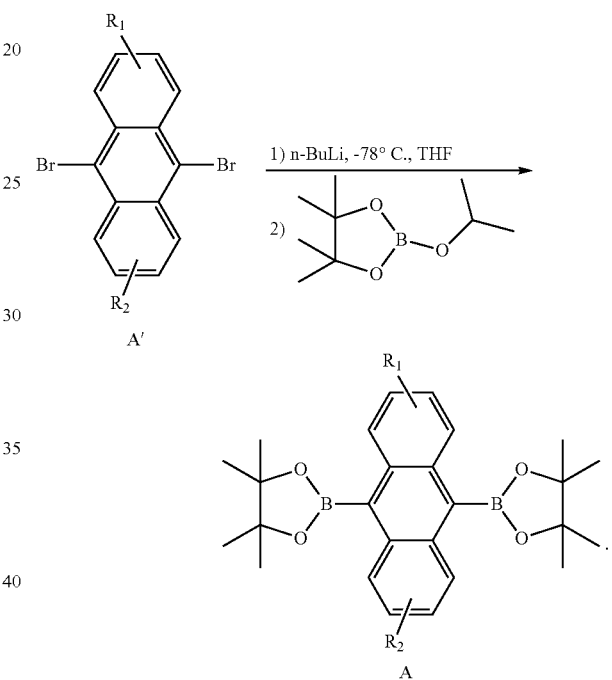

Since compound B comprises at least one unit, that is, includes at least benzoselenadiazole unit, and optionally includes thiophene unit and other quinary heterocycle units. When it only contains benzoselenadiazole unit, that is, the b in the formula (I) is 0 and a is 1, the raw material of benzoselenadiazole monomer is its dibromide, which can be obtained by the following steps:

(1) Preparation of 3,6-dibromo-1,2-diaminobenzene, of which the equation is represented as follows:

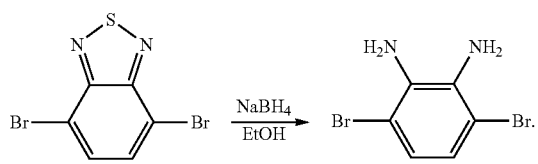

The specific preparation is described as follows: dissolving 4,7-dibromo-2,1,3-benzothiadiazole in organic solvent such as ethanol, adding appropriate sodium borohydride at 0° C., then raising the temperature to room temperature, stirring for 12-24 hours, distilling organic solvent of reaction product, after adding water, washing with saline water, then extracting with diethyl ether, drying with anhydrous sodium sulfate. 3,6-dibromo-1,2-diaminobenzene is obtained after solvent is rotary dried.

(2) Preparation of 4,7-dibromo-2,1,3-benzoselenadiazole, of which the equation is represented as follows:

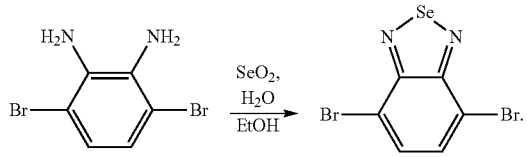

The specific preparation is described as follows: refluxing 3,6-dibromo-1,2-diaminobenzene in ethanol solution, then adding into selenium dioxide dissolved in hot water, after that, refluxing for 2 hours. The precipitation is recrystallized with ethyl acetate after being filtered to get the final product.

When compound B includes only benzoselenadiazole unit, that is when the b in formula (I) is 0 and a is 2, it is dibenzoselenadiazole monomer, of which the raw material is its dibromide likewise. It can be obtained by the following steps:

(1) Preparation of 3-bromo-1,2-diaminobenzene, of which the equation is represented as follows:

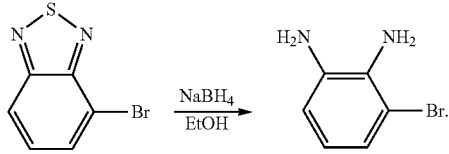

The specific preparation is described as follows: dissolving 4-bis(2,1,3-benzothiadiazole) in organic solvent such as ethanol, adding appropriate sodium borohydride at 0° C., then raising the temperature to room temperature, stirring for 12-24 hours, distilling organic solvent of reaction product, after adding water, washing with saline water, then extracting with diethyl ether, drying with anhydrous sodium sulfate. 3-bromo-1,2-diaminobenzene is obtained after solvent is rotary dried.

(2) Preparation of 4-bromo-2,1,3-benzoselenadiazole, of which the equation is represented as follows:

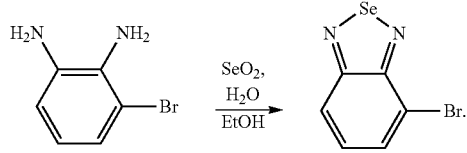

The specific preparation is described as follows: refluxing 3-bromo-1,2-diaminobenzene in ethanol solution, then adding into selenium dioxide dissolved in hot water, after that, refluxing for 2 hours. The precipitation is recrystallized with ethyl acetate after being filtered to get 4-bromo-2,1,3-benzoselenadiazole finally.

(3) Preparation of 4-4,4,5,5-tetramethyl-1,3,2-dioxaborolane-2,1,3-benzoselenadiazole, of which the specific equation is represented as follows:

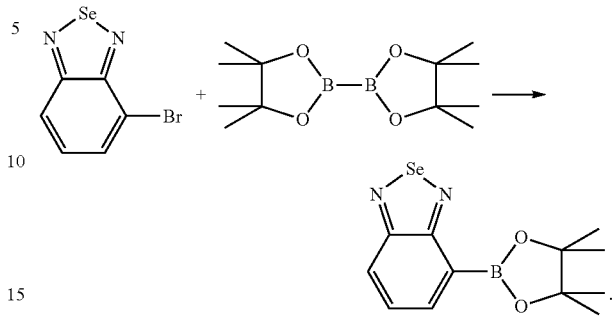

The specific preparation is described as follows: dissolving 4-bromo-2,1,3-benzoselenadiazole, bis(pinacolato)diboron, potassium acetate in dry 1,4-dioxane and bubbling with nitrogen. Then adding 1,1-bis(diphenylphosphino) ferrocene palladium dichloride, heating and stirring for 20 hours at 105° C. Extracting with ethyl acetate after washing with saturated salt solution, drying through anhydrous sodium sulfate, at last, separating and purifying on silica gel column with ethyl acetate and normal hexane used as solvent to get product represented in the equation.

(4) Preparation of bis(2,1,3-benzoselenadiazole), of which the specific equation is represented as follows:

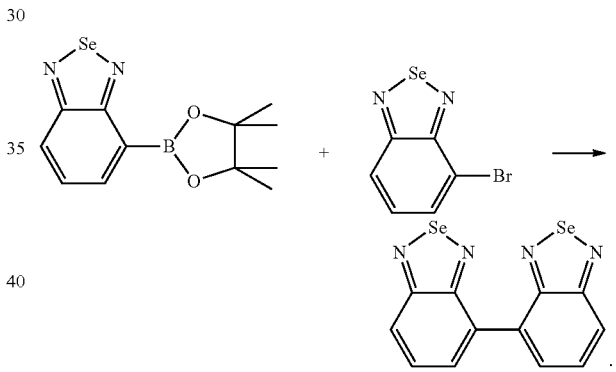

The specific preparation is described as follows: placing borate ester substituted product of 4-bromo-2,1,3-benzoselenadiazole (i.e. the product obtained in step (3)) and 4-bromo-2,1,3-benzoselenadiazole, palladium-tetrakis (triphenyl-phosphine), sodium carbonate aqueous solution into reactor, stirring for 20 hours under the deoxygenization at 100° C. Extracting with dichloromethane after washing with saturated salt solution, drying through anhydrous sodium sulfate, at last, separating and purifying on silica gel column with ethyl acetate and normal hexane which is used as solvent to get product represented in the equation.

(5) Preparation of 7,7'-dibromo-4,4'-bis(2,1,3-benzoselenadiazole), of which the specific equation is represented as follows:

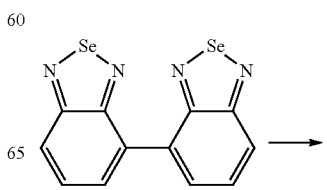

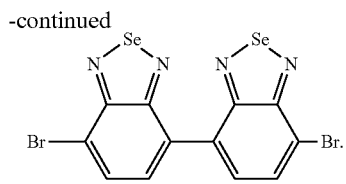

The specific preparation is described as follows: dissolving dibenzoselenadiazole obtained in step (4) in hydrobromide, adding Br$_2$, stirring for 3 days at 130° C. Adding saturated sodium sulfate solution into reaction solution, leaching and vacuum drying to get 7,7'-dibromo-4,4'-bis(2,1,3-benzoselenadiazole) product as compound B.

When compound B comprises at least one quinary heterocycle units besides benzoselenadiazole unit, that is, the b in the formula (I) is 1 or 2, of which the raw material is its dibromide likewise. There are four cases specifically: (i) a=b=1; (ii) a=b=2; (iii) a=1, b=2, (vi) a=2, b=1. The preparation of compound B under these cases will be illustrated in the following embodiments in detail.

In the step S20, the catalyst provided in polymerization is organopalladium catalyst or mixture of organopalladium catalyst and organic phosphine ligands, of which the amount is equivalent to 0.5%-10% of the molar amount of compound A. The provided organic solvent is methylbenzene, tetrahydrofuran, glycol dimethyl ether, benzene or N,N-dimethyl formamide. The alkaline solution can be inorganic alkaline solution or organic alkaline solution. Inorganic alkaline solution can be alkali metal hydroxide or aqueous solution of alkali metal carbonate, for instance, it can be but not limited to sodium hydroxide solution, potassium hydroxide, sodium carbonate solution, potassium carbonate solution and so on. Sodium carbonate solution is preferred. Organic alkaline solution can be aqueous solution of alkyl ammonium hydroxide, for instance, it can be but not limited to tetramethyl ammonium hydroxide, tetraethyl ammonium hydroxide, tetrapropyl ammonium hydroxide, tetrabutyl ammonium hydroxide and other aqueous solution. The amount of said alkaline solution can be 5 to 10 times as much as the molar amount of compound A. When catalyst provided in polymerization is organopalladium catalyst or mixture of organopalladium catalyst and organic phosphine ligands, in said mixture the molar ratio of organopalladium catalyst to organic phosphine ligands is 1:2 to 20. Organic solvent is weak polar or polar aprotic organic solvent or its mixed solvent, for instance, it can be but not limited to chloroform, dichloromethane, glycol dimethyl ether, dimethyl sulfoxide (DMSO), tetrahydrofuran (THF), methylbenzene, dimethylbenzene or its similar compounds. Methylbenzene is preferred. Sufficient dosage of solvent enables various reactants to dissolve and react completely. Polymerization reacts for 1 to 7 days under the temperature in the range of 60° C. to 100° C.

The specific process of polymerization is described as follows: adding compounds A and B, catalyst, alkaline solution, and organic solvent into reactor to have reaction system without oxygen, reacting for 1 to 7 days under the temperature in the range of 60° C. to 100° C. After the reaction, adding deionized water and organic solvent into reactor of product to carry out the extraction. Taking the organic phase, evaporating the polymer/organic solvent by vacuum distillation method, dripping it into anhydrous methanol and stirring continuously for several hours, gradually a solid is being precipitated. The solid powder obtained after being leached and dried is polymerization product.

After obtaining the polymerization product, conduct a purification as follows: dissolving polymerization product, that is, the solid powder, in chloroform, purifying by means of column chromatography on neutral aluminum oxide chromatographic column removing catalyst, and then rotary evaporating polymerization product and chloroform solution, dripping methanol solvent and stirring for several hours, drying, extracting copolymer in Soxhlet extractor to obtain copolymer comprising anthracene and benzoselenadiazole.

In said reaction steps, the amount of reactants can be according with the stoichiometric ratio shown in equation, also, part of reactants can be in excess, where the preparing method of the present embodiment can be carried out without impacts on the reaction.

In said preparing method of the copolymer comprising anthracene and benzoselenadiazole, monomers compounds A and B can synthesize the desired product; the synthetic route is relatively simple and mature, thereby reducing the process, reducing manufacturing costs. And in the preparation process, it is easy to improve the solubility of the product and promote the film processing performance of copolymer through the introduction of alkyl or alkoxy.

The copolymer in the present embodiment can be implemented in kinds of photoelectricity or semiconductor technology fields, for instance, organic optoelectronic materials, polymer solar cell device, organic field effect transistors, organic light-emitting devices, organic optical storage devices, organic nonlinear materials and organic laser devices, etc. Wherein, organic optoelectronic material includes said copolymer comprising anthracene and benzoselenadiazole which is used as electron donor material and/or photon-to-electron conversion material, etc. Further description will be illustrated, which takes solar cell device, organic field effect transistors, and organic light-emitting devices as examples. Others like organic optical storage devices, organic nonlinear materials and organic laser devices are similar to the followings, which all use the copolymer in the present embodiment as their optical storage material, nonlinear materials, laser materials or semiconductor materials, etc.

Figure 3:
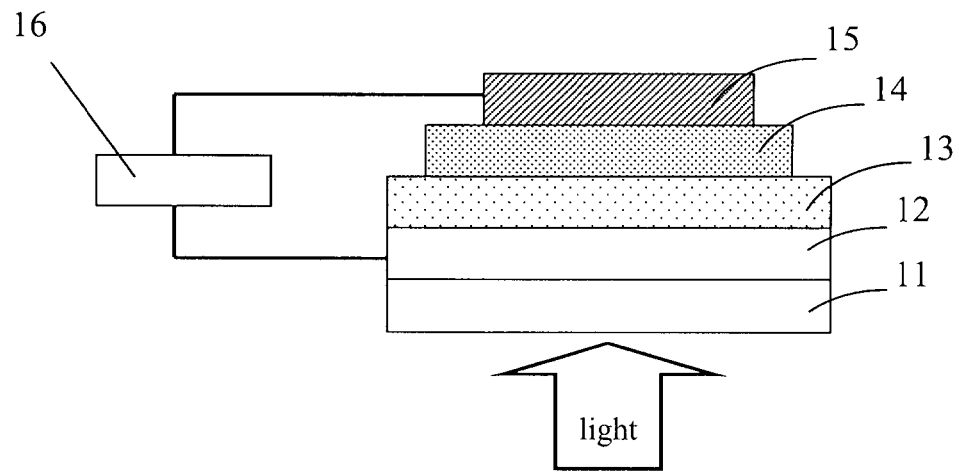
FIG. 3 shows the structure diagram of solar cell device with the copolymer comprising anthracene and benzoselenadiazole in the embodiments of the present invention.

Referring to FIG. 3, solar cell device, in which the copolymer comprising anthracene and benzoselenadiazole in the present embodiment is provided, includes glass base layer 11, transparent anode 12, middle auxiliary layer 13, active layer 14, cathode 15, which stack successively. Buffer layer 13 uses polyethylene 3,4-thiophene: polystyrene-sulfuric acid composite (abbr. PEDOT:PSS), active layer 14 includes electron donor material and electron acceptor material, electron donor material uses said copolymer comprising anthracene and benzoselenadiazole, electron acceptor material can be [6,6]phenyl-$C_{61}$— methyl butyrate (abbr. PCBM). Transparent anode 12 can be indium tin oxide (abbr. ITO), preferably for indium tin oxide with square resistance of 10 to 20Ω. The cathode 15 can be aluminum electrode, but not limited to it. Wherein, glass basement 11 can be the bottom layer. During the making, deposit ITO electrode on glass basement 11, and then forming middle auxiliary layer 13 in ITO electrode by oxygen-plasma spraying (oxygen-Plasma) treatment process, and deposit copolymer comprising anthracene and benzoselenadiazole and electron acceptor materials on middle auxiliary layer 13 by spin-coating to form an active layer 14. Then deposit cathode 15 on the active layer 14 through vacuum evaporation to obtain the above-mentioned solar cell devices.

As shown, in the light, the light goes through glass base layer 11 and ITO electrode 12. Copolymer comprising anthracene and benzoselenadiazole in active layer 14 absorbs solar energy, and generates exciton. The exciton migrate to the interface of electron donor/acceptor of material, and transfer electron to the electron acceptor material, such as PCBM, resulting in charge separation and free carrier, namely, free electrons and holes. These free electrons pass along the electron acceptor material to the metal cathode and are collected by cathode, free holes pass along electron donor material to the ITO anode and are collected by anode to generate photocurrent and photovoltage, achieve photon-to-electron conversion. When it connects to load 16, it can be supplied with power. In this process, copolymer comprising anthracene and benzoselenadiazole because of its very wide wavelength range of spectrum response, is able to make better use of solar energy, to obtain a higher photon-to-electron conversion efficiency, to increase the electricity production capacity of solar cell devices. And this organic material can reduce the weight of solar cell devices, and be produced by spin-coating and other technologies, facilitate to manufacture on a large scale.

Figure 4:
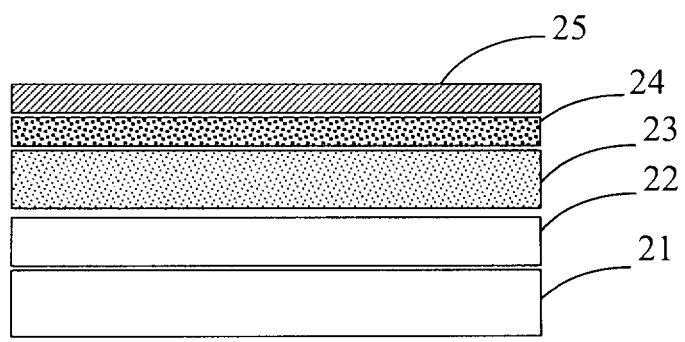
FIG. 4 shows the structure diagram of organic light-emitting device with the copolymer comprising anthracene and benzoselenadiazole in the embodiments of the present invention.

Referring to FIG. 4, organic light-emitting device, in which the copolymer comprising anthracene and benzoselenadiazole in the present embodiment is provided, includes glass base layer 21, transparent anode 22, light-emitting layer 23, buffer layer 24, cathode 25, which stack successively. Transparent anode 22 can be indium tin oxide (abbr. ITO), preferably for indium tin oxide with square resistance of 10 to 20Ω. Light-emitting layer 23 includes the copolymer comprising anthracene and benzoselenadiazole in the embodiment. The buffer layer 24 can be LiF, etc, but not limited to it. Cathode 25 can be but not limited to metal Al or Ca, Ba, etc. Thus, in a specific embodiment, the organic light-emitting device structure is expressed as: ITO/copolymer comprising anthracene and benzoselenadiazole/LiF/Al. Layers can be formed by the existing methods, while copolymer comprising anthracene and benzoselenadiazole can be formed on ITO by spin-coating technology.

Figure 5:
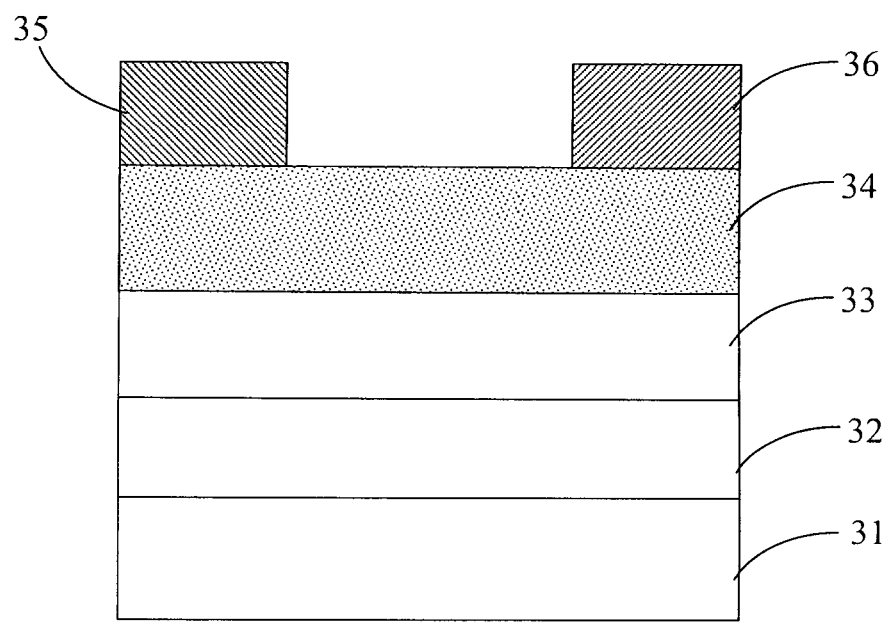
FIG. 5 shows the structure diagram of organic field effect transistors with the copolymer comprising anthracene and benzoselenadiazole in the embodiments of the present invention.

Referring to FIG. 5, organic field-effect transistor, in which the copolymer comprising anthracene and benzoselenadiazole in the present embodiment is provided, includes substrates 31, the insulating layer 32, the modified layer 33, the organic semiconductor layer 34 and, source electrode 35 and a drain electrode 36 set on organic semiconductor layer 34, which stack successively. Wherein, the substrate 31 can be but not limited to highly doped silicon (Si, the insulating layer 32 can be but not limited to $SiO_2$ of micro-nano (450 nm for example) thickness. Organic semiconductor layer 34 uses the copolymer comprising anthracene and benzoselenadiazole. Source electrode 35 and drain 36 can use but not limited to gold. Modified layer 33 can be but not limited to octadecyltrichlorosilane. Substrate 31, insulating layer 32, the modified layer 33, source electrode 35 and drain 36 can be formed by the existing methods. Organic semiconductor layer 34 can be under vacuum degree close to $10^{-4}$ Pa, spin coating the copolymer comprising anthracene and benzoselenadiazole in the embodiment on the insulating layer 32 which is modified by the modified layer 33.

Special embodiments are disclosed as follows to demonstrate preparation method of copolymer comprising anthracene and benzoselenadiazole and the performance of it.

EXAMPLE 1

Copolymer comprising anthracene and benzoselenadiazole in the present Example 1 is abbreviated to PAn-DOTBSe, wherein a=b=1, $R_1$ and $R_2$ are H, $R_3$ and $R_7$ use $OC_{10}H_{21}$, X and Y are S, of which the formula is represented as the final product in the following equation.

It can be seen from the formula, copolymer comprising anthracene and benzoselenadiazole in the present Example 1 has symmetrical structure, each unit has dithiophene ring and benzoselenadiazole and anthracene. With such symmetrical structure, copolymer comprising anthracene and benzoselenadiazole is endowed with relatively excellent stability and film-forming properties. On the other hand, it has good absorbance performance and photoelectric properties, etc.

Specific preparation of copolymer PAn-DOTBSe is described as follows:

Step 1, preparation of 9,10-bis(4,4,5,5-tetramethyl-1,3,2-dioxaborolane)yl-anthracene, of which the equation is represented as follows:

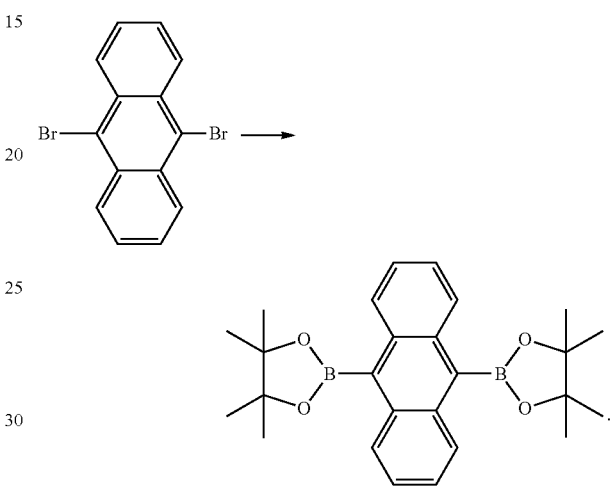

Specific preparation is described as follows: set up anhydrous oxygen-free reactor, under the continuous stirring and the protection of $N_2$, adding pale yellow crystal-like 9,10-dibromoanthracene (7.2 mmol) into three-necked flask, injecting 120 ml of refined tetrahydrofuran solvent with injector, then injecting 21.6 mmol of n-BuLi with injector at −78° C. The reaction system is gradually getting orange red from pale yellow, stirring for 2 hours. After a 2-hour reaction, injecting 24.5 mmol of 2-isopropoxy-4,4,5,5-tetramethyl-1,3,2-dioxaborolane with injector at −78° C., the whole reaction system becomes pale yellow from orange red. When temperature rises to room temperature, conduct the reaction overnight. After the reaction, adding saturated sodium chloride aqueous solution, extracting with chloroform, drying with anhydrous sodium sulfate. Collect the filtrate and rotary evaporate solvent after leaching. At last, separate the colature by column chromatography on silica gel column with petroleum ether-ethyl acetate used as eluent to get final product. The test result is GC-MS (EI-m/z): 430 (M$^+$).

Step 2, preparation of 4,7-bis(5-bromo-3-decyloxythiophene)yl-2,1,3-benzoselenadiazole, which reacts as follows:

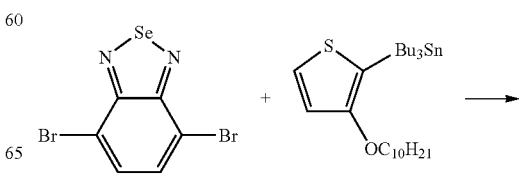

-continued

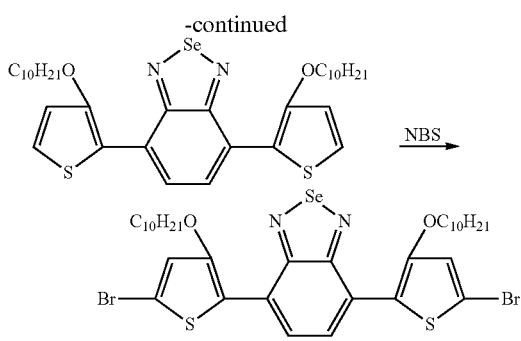

Specific preparation is described as follows: (1) dissolving 4,7-dibromo-2,1,3-benzoselenadiazole (1 mmol) and 2-tributylstannyl-3-decyloxyl thiophene (2.2 mmol) in anhydrous methylbenzene solvent, then adding palladium-tetrakis (triphenylphosphine) (0.03 mmol), refluxing and reacting under the protection of nitrogen overnight. After cooling, make it subsided in methanol solvent to get the product in 68% yield after purification on silica gel column, GC-MS (EI-m/z): 347 ($M^+$).

(2) dissolving 1 mmol of the product in step (1) and 2.3 mmol of N-bromosuccinimide (NBS) in 200 ml of chloroform solvent, adding into two-necked flask under the protection of argon and stirring continuously, conducting the reaction at room temperature in opaque background for 50 hours. Adding the product into 200 ml of methanol solvent, gradually a solid is being precipitated, filtering, washing colature with hot methanol 2 times. Conducting a purification by column chromatography on silica gel column to get solid powder product in 72% yield, GC-MS (EI-m/z): 505 ($M^+$).

Step 3, preparation of copolymer PAn-DOTBSe, of which the equation is represented as follows:

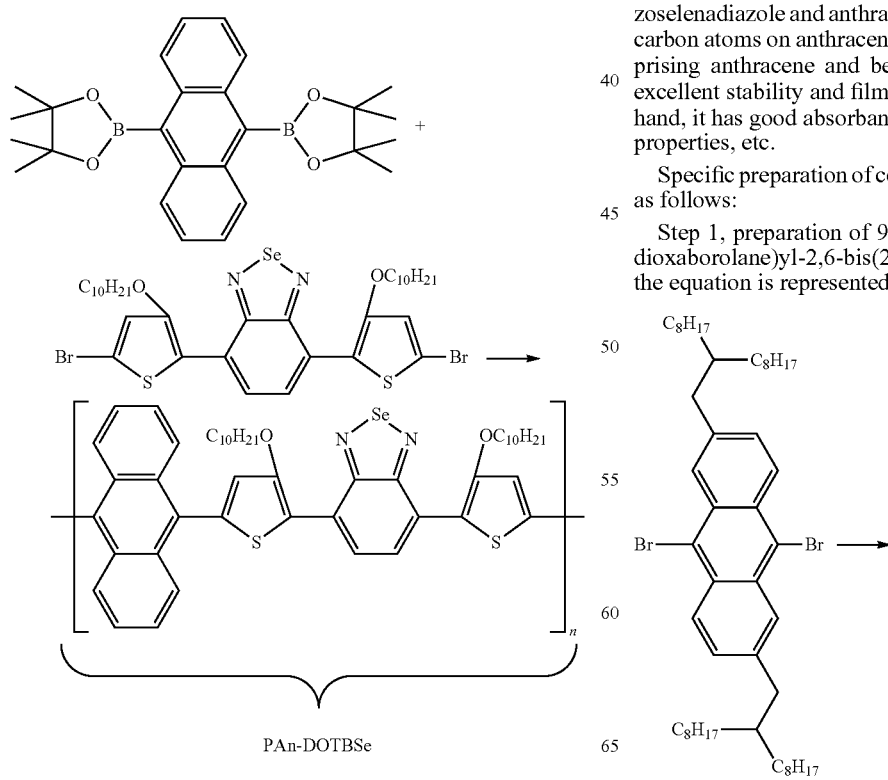

PAn-DOTBSe

Specific preparation is described as follows: adding 9,10-bis(4,4,5,5-tetramethyl-1,3,2-dioxaborolane)yl-anthracene (1.0 mmol), 4,7-bis(5-bromo-3-decyl-oxythiophene)yl-2,1,3-benzoselenadiazole (1.0 mmol), palladium-tetrakis(triphenyl-phosphine) (0.025 mmol), 2 mol/L sodium carbonate aqueous solution (5 ml) and methylbenzene solvent (30 ml) into reactor, making the reaction system without oxygen by supplying $N_2$ and vacuumizing, reacting at 90° C. for 70 h. After the reaction, adding deionized water and methylbenzene into reaction flask of product to carry out the extraction. Take the organic phase, evaporating the polymer/methylbenzene solution to around 5 ml by vacuum distillation method, dripping it into 300 ml of anhydrous methanol and stirring continuously for about 4 hours, gradually a solid is being precipitated. The solid powder is obtained after being leached and dried. Dissolving the solid powder in chloroform, purifying by means of column chromatography on neutral aluminum oxide chromatographic column to remove catalyst palladium-tetrakis(triphenylphosphine), and then rotary evaporating polymer/chloroform solution to around 5 ml, dripping it into methanol solvent and stirring for several hours, collecting and drying polymer PAn-DOTBSe, extract polymer in Soxhlet extractor to improve the monodispersity of the polymer molecular weight. The yield is about 58%. Test Polymer PAn-DOTBSe by GPC, number-average molecular weight is about 84870. The monodispersity of the polymer is 1.86.

EXAMPLE 2

The copolymer in the present embodiment is abbreviated to PODA-BSe, wherein b is 0, a is 1, $R_1$ and $R_2$ are 2-octyldecyl, of which the formula is represented as the final product in the following equation.

It can be seen from the formula, copolymer in the present embodiment has symmetrical structure, each unit has benzoselenadiazole and anthracene, and there is alkyl chain of 18 carbon atoms on anthracene, which endows copolymer comprising anthracene and benzoselenadiazole with relatively excellent stability and film-forming properties. On the other hand, it has good absorbance performance and photoelectric properties, etc.

Specific preparation of copolymer PODA-BSe is described as follows:

Step 1, preparation of 9,10-bis(4,4,5,5-tetramethyl-1,3,2-dioxaborolane)yl-2,6-bis(2-octyldecyl)anthracene, of which the equation is represented as follows:

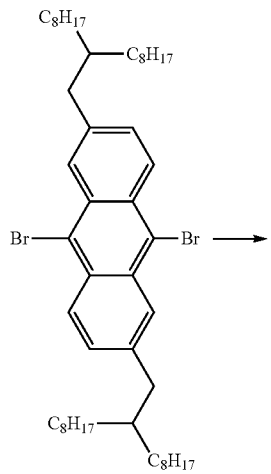

-continued

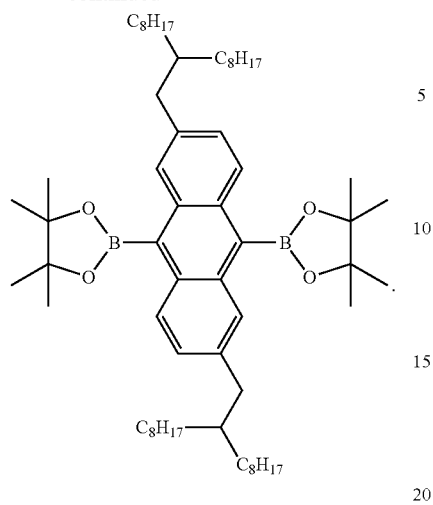

Specific preparation is described as follows: set up anhydrous oxygen-free reactor, under the continuous stirring and the protection of $N_2$, adding 9,10-dibromo-2,6-bis(2-octyldecyl)anthracene (5 mmol) into three-necked flask, injecting 150 ml of refined tetrahydrofuran solvent with injector, then adding 15 mmol of n-BuLi at −78° C., stirring for 2 hours. After a 2-hour reaction, injecting 15 mmol of 2-isopropoxy-4,4,5,5-tetramethyl-1,3,2-dioxaborolane with injector at −78° C. When temperature rises to room temperature, conduct the reaction overnight. After the reaction, adding saturated sodium chloride aqueous solution, extracting with chloroform, drying with anhydrous sodium sulfate. Collect the filtrate and rotary evaporate solvent after leaching. At last, separate the colature by column chromatography on silica gel column with appropriate solvent used as eluent to get final product. The test result is GC-MS (EI-m/z): 935 (M+).

Step 2, preparation of copolymer PODA-BSe, of which the equation is represented as follows:

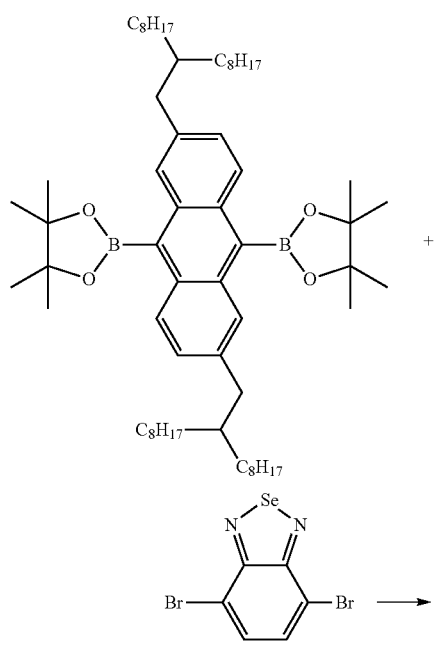

-continued

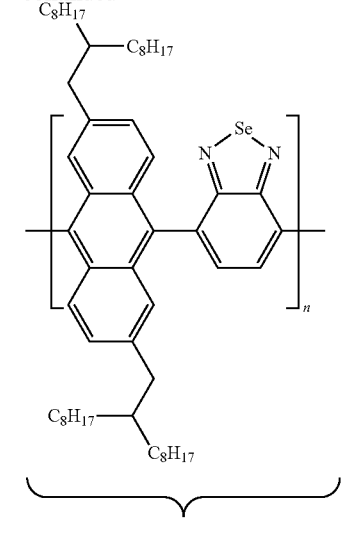

PODA-BSe

Specific preparation is described as follows: adding 9,10-bis(4,4,5,5-tetramethyl-1,3,2-dioxaborolane)yl-2,6-bis(2-octyldecyl)anthracene (1 mmol), 4,7-dibromo-2,1,3-benzoselenadiazole (1 mmol), palladium-tetrakis (triphenylphosphine) (0.015 mmol), 2 mol/L sodium carbonate aqueous solution (4 ml) and methylbenzene solvent (20 ml) into two-necked flask, making the reaction system without oxygen by supplying $N_2$ and vacuumizing, reacting at 60° C. for 72 h. After the reaction, adding deionized water and methylbenzene into reaction flask to carry out the extraction. Take the organic phase, evaporating the polymer/methylbenzene solution to around 5 ml by vacuum distillation method, dripping it into 300 ml of anhydrous methanol and stirring continuously for about 4 hours, gradually a solid is being precipitated. The solid powder is obtained after being leached and dried. Dissolving the solid powder in chloroform, purifying by means of column chromatography on neutral aluminum oxide chromatographic column to remove catalyst palladium-tetrakis (triphenylphosphine), and then rotary evaporating polymer/chloroform solution, collecting and drying polymer. The yield is about 61%. Test Polymer PODA-BSe by GPC, number-average molecular weight is about 9400. The monodispersity of the polymer is 1.63.

EXAMPLE 3

The copolymer in the present embodiment is abbreviated to PODA-SeBSe, wherein a=b=1, $R_1$ and $R_2$ are 2-octyldecyl, $R_3$ and $R_7$ are H, X and Y are Se, of which the formula is represented as the final product in the following equation.

It can be seen from the formula, copolymer comprising anthracene and benzoselenadiazole in the present embodiment has symmetrical structure, each unit has dithiophene ring and benzoselenadiazole and anthracene. With such symmetrical structure and the alkyl chain of 18 carbon atoms on anthracene, copolymer comprising anthracene and benzoselenadiazole is endowed with relatively excellent stability and film-forming properties. On the other hand, it has good absorbance performance and photoelectric properties, etc.

Specific preparation of copolymer PODA-SeBSe is described as follows:

Step 1, preparation of 9,10-bis(4,4,5,5-tetramethyl-1,3,2-dioxaborolane)yl-2,6-bis(2-octyldecyl)anthracene, preparation of this compound is almost the same as that in the Example 2, which it is not discussed here, with reference to the above steps.

Step 2, preparation of 4,7-bis(5'-bromo-2'-selenophen)yl-2,1,3-benzoselenadiazole, of which the equation is represented as follows:

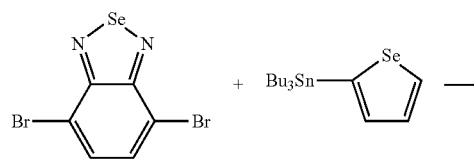

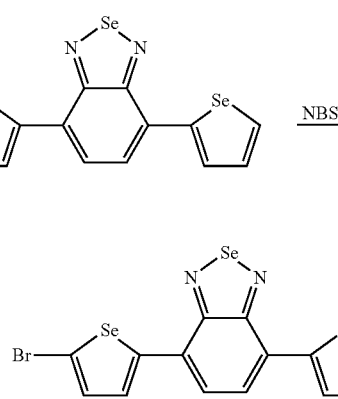

Specific preparation is described as follows:

(1) dissolving 4,7-dibromo-2,1,3-benzoselenadiazole (1 mmol) and 2-tributylstannyl selenophen (2.2 mmol) in anhydrous methylbenzene solvent, then adding palladium-tetrakis(triphenylphosphine) (0.03 mmol), refluxing and reacting under the protection of nitrogen overnight. After cooling, make it subsided in methanol solvent to get 4,7-bis(2'-selenophen)yl-2,1,3-benzoselenadiazole in 61% yield after purification on silica gel column, GC-MS (EI-m/z): 441 (M+).

(2) dissolving 1 mmol of 4,7-bis(2'-selenophen)yl-2,1,3-benzoselenadiazole and 2.3 mmol of N-bromosuccinimide (NBS) in 200 ml of chloroform solvent, adding into two-necked flask under the protection of argon and stirring continuously, conducting the reaction at room temperature in opaque background for 50 hours. Adding the product into 200 ml of methanol solvent, gradually a solid is being precipitated, filtering, washing colature with hot methanol 2 times. Conducting a purification by column chromatography on silica gel column to get solid powder product 4,7-bis(5'-bromo-2'-selenophen)yl-2,1,3-benzoselenadiazole in 65% yield. The test result is GC-MS (EI-m/z): 599 (M+).

Step 3, preparation of copolymer PODA-SeBSe, of which the equation is represented as follows:

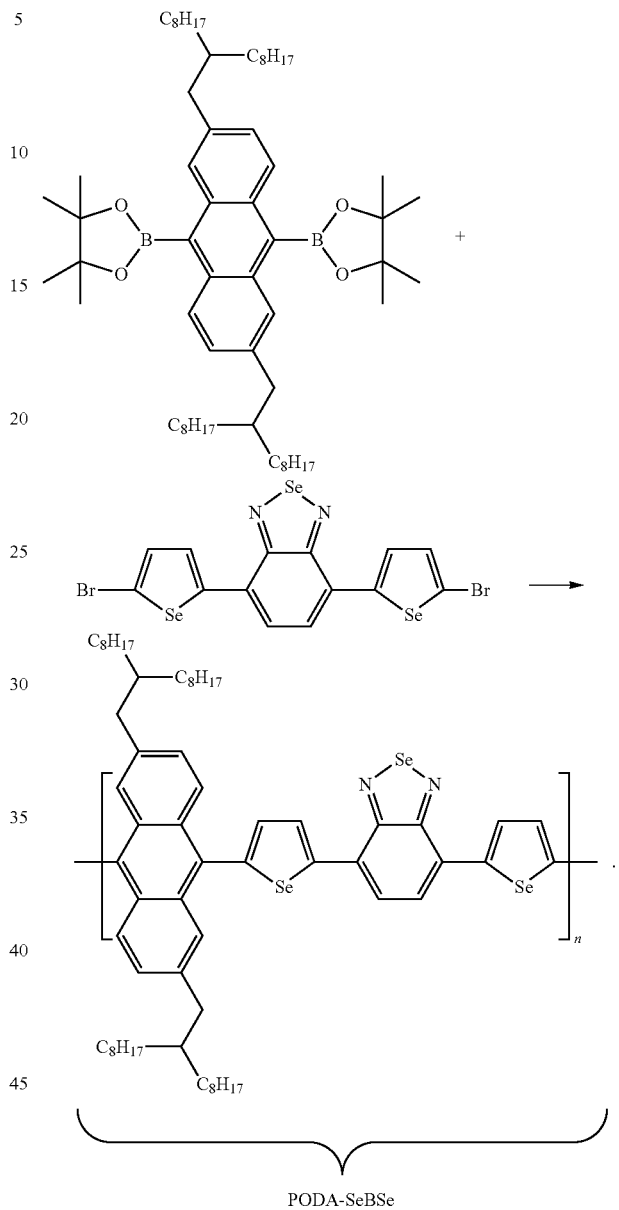

Specific preparation is described as follows: adding 9,10-bis(4,4,5,5-tetramethyl-1,3,2-dioxaborolane)yl-2,6-bis(2-octyldecyl)anthracene (1 mmol), 4,7-bis(5'-bromo-2'-selenophen)yl-2,1,3-benzoselenadiazole (1 mmol), palladium-tetrakis (triphenylphosphine) (0.015 mmol), 2 mol/L sodium carbonate aqueous solution (4 ml) and methylbenzene solvent (20 ml) into two-necked flask, making the reaction system without oxygen by supplying $N_2$ and vacuumizing, reacting at 90° C. for 62 h. After the reaction, adding deionized water and methylbenzene into reaction flask to carry out the extraction. Take the organic phase, evaporating the polymer/methylbenzene solution to around 5 ml by vacuum distillation method, dripping it into 300 ml of anhydrous methanol and stirring continuously for about 4 hours, gradually a solid is being precipitated. The solid powder is obtained after being leached and dried. Dissolving the solid powder in chloroform, purifying by means of column chromatography on neutral aluminum oxide chromatographic column to remove catalyst palladium-tetrakis(triphenylphosphine), and then rotary evaporating polymer/chloroform solution, collecting and drying polymer. The yield is about 58%. Test polymer PODA-SeBSe by GPC, number-average molecular weight is about 78600. The monodispersity of the polymer is 1.81.

EXAMPLE 4

The copolymer in the present embodiment is abbreviated to PODA-DBSe, wherein a is 2, b is 0, $R_1$ and $R_2$ are 2-octyldecyl, of which the formula is represented as the final product in the following equation.

It can be seen from the formula, copolymer in the present embodiment has better symmetrical structure, and each unit has two benzoselenadiazole and anthracene. With such symmetrical structure and the alkyl chain of 18 carbon atoms on anthracene, copolymer comprising anthracene and benzoselenadiazole is endowed with relatively excellent stability and film-forming properties. On the other hand, copolymer has double benzoselenadiazole structure, which makes it have good absorbance performance and photoelectric properties, etc.

Specific preparation of PODA-DBSe is described as follows:

Step 1, preparation of 3-bromo-1,2-diaminobenzene, of which the equation is represented as follows:

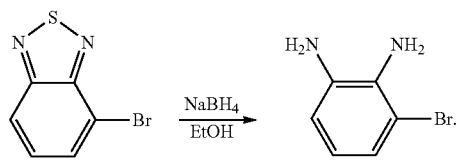

Specific preparation is described as follows: dissolving 4-bromo-2,1,3-benzothiadiazole (20 mmol) in ethanol solvent (180 ml), adding sodium borohydride (0.38 mmol) at 0° C., then raising the temperature to room temperature, stirring for 24 hours, distilling organic solvent of reaction product, after adding water (200 ml), washing with saline water, then extracting with diethyl ether, drying with anhydrous sodium sulfate. Product is obtained after solvent is rotary dried. The test result is GC-MS (EI-m/z): 186 (M+).

Step 2, preparation of 4-bromo-2,1,3-benzoselenadiazole, of which the equation is represented as follows:

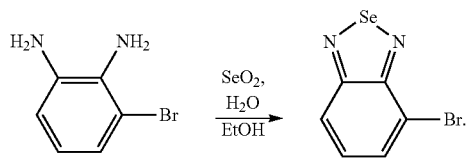

Specific preparation is described as follows: refluxing 3-bromo-1,2-diaminobenzene (10 mmol) in 60 ml of ethanol solution, then adding into selenium dioxide (10.5 mmol) dissolved in hot water (20 ml) for a 2-hour refluxing reaction. The precipitation is recrystallized with ethyl acetate after being filtered to get the product finally. GC-MS (EI-m/z): 262 (M+).

Step 3, preparation of 4-4,4,5,5-tetramethyl-1,3,2-dioxaborolane-2,1,3-benzoselenadiazole, of which the equation is represented as follows:

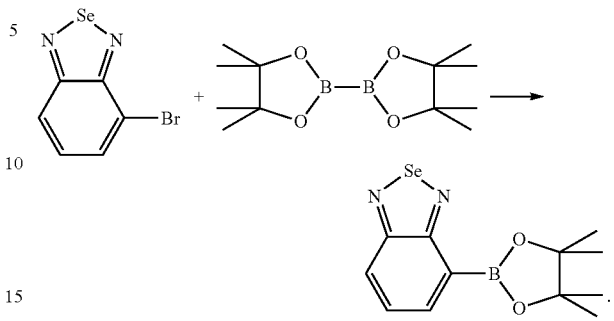

Specific preparation is described as follows: dissolving 4-bromo-2,1,3-benzoselenadiazole (2.33 mmol), bis(pinacolato)diboro (2.79 mmol), potassium acetate (6.66 mmol) in dry 1,4-dioxane (7 ml) and bubbling with nitrogen for 30 minutes. Then adding 1,1-bis(diphenylphosphino)ferrocene palladium dichloride (0.116 mmol), heating and stirring for 20 hours at 105° C. Extract with ethyl acetate after washing with saturated salt solution, drying through anhydrous sodium sulfate, at last, separating and purifying on silica gel column with ethyl acetate and normal hexane used as solvent to get product. The test result is GC-MS (EI-m/z): 309 (M+).

Step 4, preparation of bis(2,1,3-benzoselenadiazole), of which the equation is represented as follows:

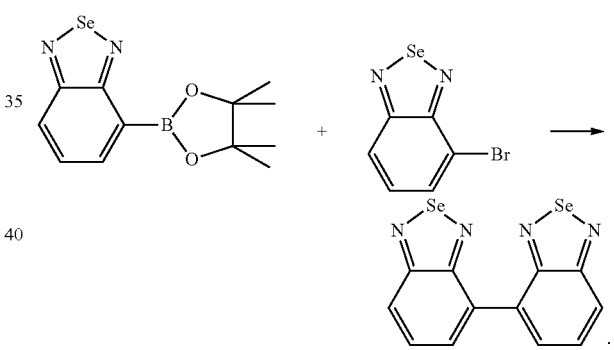

Specific preparation is described as follows: placing borate ester substituted product of 4-bromo-2,1,3-benzoselenadiazole (5 mmol) and 4-bromo-2,1,3-benzoselenadiazole (4.5 mmol), palladium-tetrakis(triphenylphosphine) (0.075 mmol), sodium carbonate aqueous solution into three-necked flask, stirring for 20 hours under the deoxygenization at 100° C. Extract with dichloromethane after washing with saturated salt solution, drying through anhydrous sodium sulfate, at last, separating and purifying on silica gel column with ethyl acetate and normal hexane used as solvent to get product. GC-MS (EI-m/z): 366 (M+).

Step 5, preparation of 7,7'-dibromo-4,4'-bis(2,1,3-benzoselenadiazole), of which the equation is represented as follows:

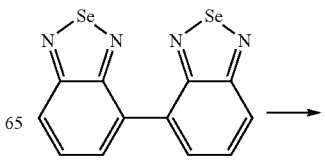

-continued

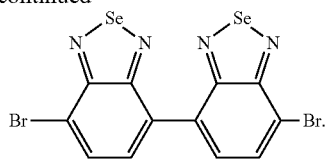

Specific preparation is described as follows: dissolving dibenzoselenadiazole (1 mmol) in hydrobromide (10 ml), adding $Br_2$ (4.5 mmol), stirring for 3 days at 130° C. Adding saturated sodium sulfate solution, leaching and vacuum drying to get product, that is, 7,7'-dibromo-4,4'-bis(2,1,3-benzoselenadiazole). The test result is GC-MS (EI-m/z): 522 (M+).

Step 6, preparation of copolymer PODA-DBSe, of which the equation is represented as follows:

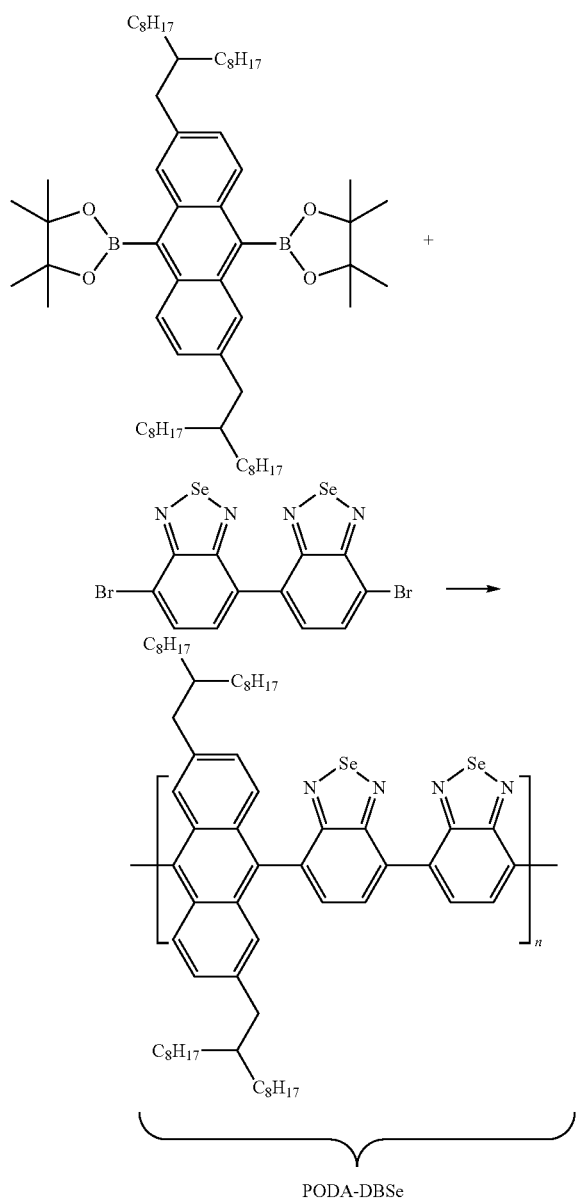

PODA-DBSe

Specific preparation is described as follows: adding 9,10-bis(4,4,5,5-tetramethyl-1,3,2-dioxaborolane)yl-2,6-bis(2-octyldecyl)anthracene (1 mmol), 7,7'-dibromo-4,4'-bis(2,1,3-benzoselenadiazole) (1 mmol), palladium-tetrakis(triphenyl-phosphine) (0.015 mmol), 2 mol/L sodium carbonate aqueous solution (3 ml) and methylbenzene solvent (30 ml) into two-necked flask, making the reaction system without oxygen by supplying $N_2$ and vacuumizing, reacting at 100° C. for 48 h. After the reaction, adding deionized water and methylbenzene into reaction flask of product to carry out the extraction. Take the organic phase, evaporating the polymer/methylbenzene solution to around 5 ml by vacuum distillation method, dripping it into 300 ml of anhydrous methanol and stirring continuously for about 3 hours, gradually a solid is being precipitated. The solid powder is obtained after being leached and dried. Dissolving the solid powder in chloroform, purifying by means of column chromatography on neutral aluminum oxide chromatographic column to remove catalyst palladium-tetrakis(triphenylphosphine), and then rotary evaporating polymer/chloroform solution, collecting and drying polymer. The yield is about 63%. Test Polymer PODA-DBSe by GPC, number-average molecular weight is about 79100. The monodispersity of the polymer is 1.88.

EXAMPLE 5

The copolymer in the present embodiment is abbreviated to PODA-DTBSe, which is short for polymer of 2,6-bis(2-octyldecyl)anthracene and 7,7-dithiophenyl-bis(2,1,3-benzoselenadiazole), wherein a=b=2, $R_1$ and $R_2$ are 2-octyldecyl, $R_3$ and $R_7$ are H, of which the formula is represented as the final product in the following equation.

It can be seen from the formula, copolymer in the present embodiment has better symmetrical structure, and each unit has two benzoselenadiazole, dithiophene and anthracene. With such symmetrical structure, copolymer comprising anthracene and benzoselenadiazole is endowed with relatively excellent stability and film-forming properties. Also, it has good absorbance performance and photoelectric properties, etc.

Specific preparation of copolymer PODA-SeBSe is described as follows:

Step 1, obtaining 3-bromo-1,2-diaminobenzene using the step 1-5 in Example 4, which is not discussed here.

Step 2, preparation of 7,7-bis(5'-bromo-dithiophene)yl-bis(2,1,3-benzoselenadiazole), that is, preparation of compound B, where the reaction flow is described as follows:

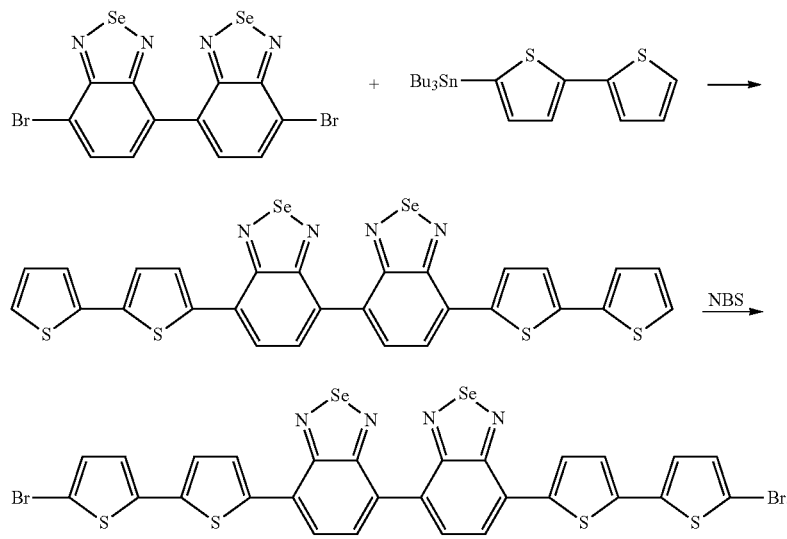

Specific preparation is described as follows:

(1) Specific preparation is described as follows: dissolving 7,7'-dibromo-4,4'-bis(2,1,3-benzoselenadiazole) (1 mmol) and 2-tributylstannyl-bithiophene (2.2 mmol) in anhydrous methylbenzene solvent, then adding palladium-tetrakis (triphenylphosphine) (0.03 mmol), refluxing and reacting under the protection of nitrogen overnight. After cooling, make it subsided in methanol solvent to get 7,7-dithiophenyl-bis(2,1,3-benzoselenadiazole) in 72% yield after purification on silica gel column, GC-MS (EI-m/z): 693 (M$^+$).

(2) Dissolving 7,7-dithiophenyl-bis(2,1,3-benzoselenadiazole) (1 mmol) and 2.5 mmol of N-bromosuccinimide (NBS) in chloroform solvent (200 ml), adding into two-necked flask under the protection of argon and stirring continuously, conducting the reaction at room temperature in opaque background for 40 hours. Adding the product into 200 ml of methanol solvent, gradually a solid is being precipitated, filtering, washing colature with hot methanol 2 times. Conducting a purification by column chromatography on silica gel column to get solid powder 7,7-bis(5'-bromo-dithiophen)yl-bis(2,1,3-benzoselenadiazole) in 74% yield, GC-MS (EI-m/z): 850 (M$^+$).

Step 3, preparation of copolymer PODA-DTBSe, of which the equation is described as follows:

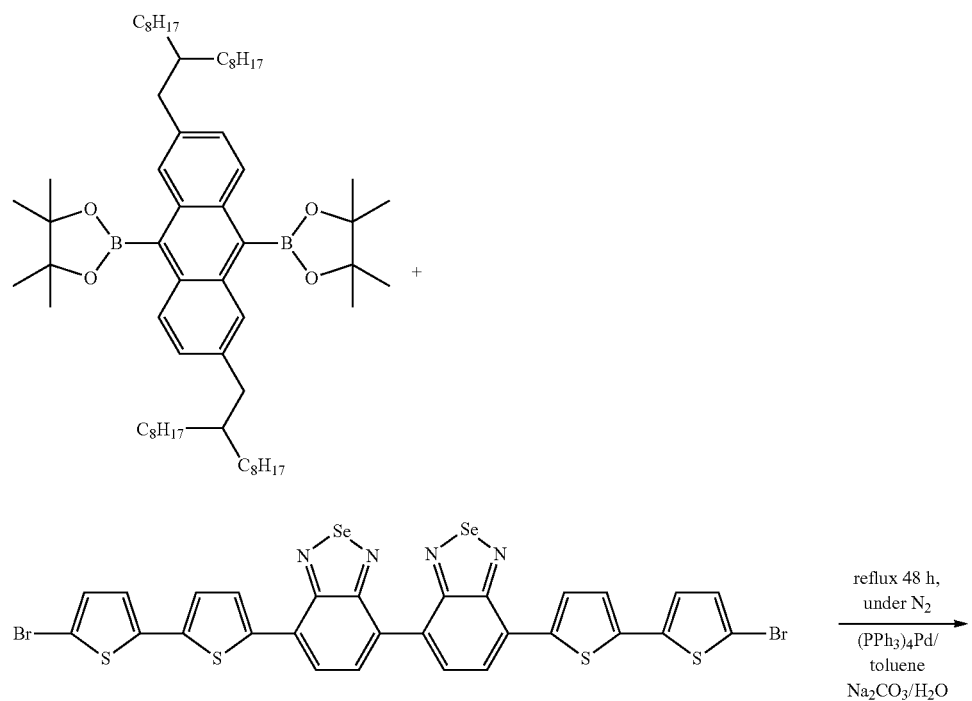

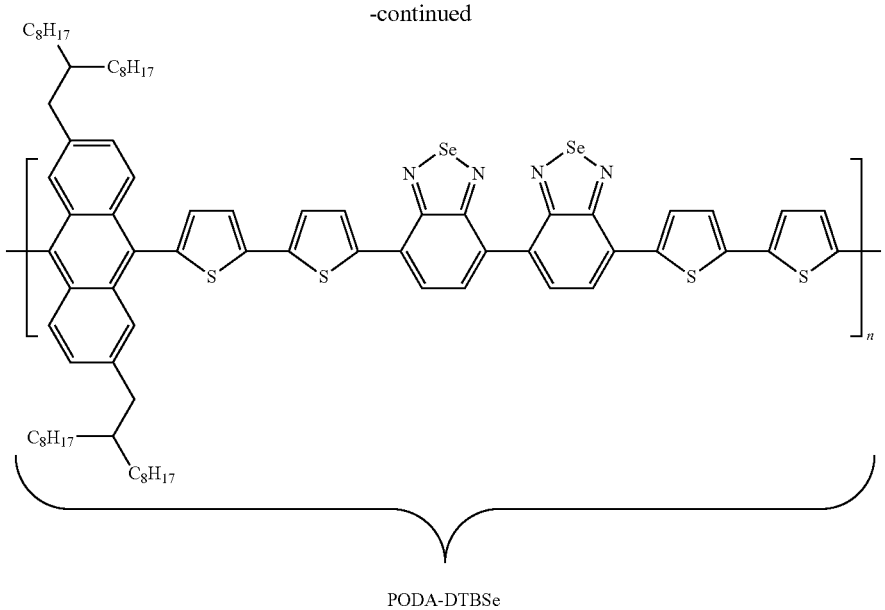

PODA-DTBSe

Specific preparation is described as follows: adding 9,10-bis(4,4,5,5-tetramethyl-1,3,2-dioxaborolane)yl-2,6-bis(2-octyldecyl)anthracene (1 mmol), 7,7-bis (5'-bromodithiophen)yl-bis(2,1,3-benzoselenadiazole) (1 mmol), palladium-tetrakis (triphenylphosphine) (0.015 mmol), 2 mol/L sodium carbonate aqueous solution (4 ml) and methylbenzene solvent (30 ml) into two-necked flask, making the reaction system without oxygen by supplying $N_2$ and vacuumizing, reacting at 105° C. for 48 h. After a 48-hour reaction, adding deionized water and methylbenzene into reaction flask to carry out the extraction. Take the organic phase, evaporating the polymer/methylbenzene solution to around 5 ml by vacuum distillation method, dripping it into 300 ml of anhydrous methanol and stirring continuously for 3 hours, gradually a solid is being precipitated. The solid powder is obtained after being leached and dried. Dissolving the solid powder in chloroform, purifying by means of column chromatography on neutral aluminum oxide chromatographic column to remove catalyst palladium-tetrakis(triphenylphosphine), and then rotary evaporating polymer/chloroform solution, collecting and drying polymer. Test Polymer PODA-DTBSe by GPC, number-average molecular weight is about 54200. The monodispersity of the polymer is 2.43.

While the present invention has been described with reference to particular embodiments, it will be understood that the embodiments are illustrative and that the invention scope is not so limited. Alternative embodiments of the present invention will become apparent to those having ordinary skill in the art to which the present invention pertains. Such alternate embodiments are considered to be encompassed within the spirit and scope of the present invention. Accordingly, the scope of the present invention is described by the appended claims and is supported by the foregoing description.

What is claimed is:

1. A copolymer comprising anthracene and benzoselenadiazole, which is represented by formula (I),

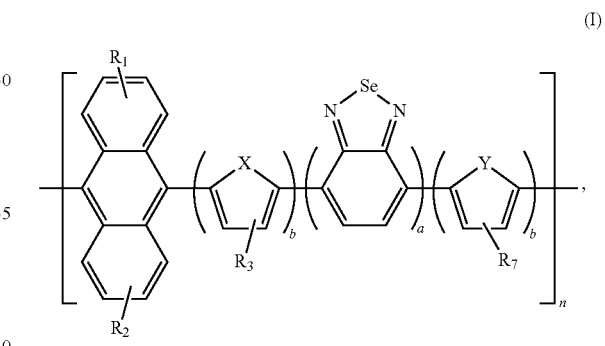

wherein n is a natural number from 10 to 1000, a is 1 or 2, b is 0, 1 or 2; X, Y are Se or $SO_2$, N—$R_4$, $R_5$—Si—$R_6$; $R_4$, $R_5$, $R_6$ are selected from $C_1$-$C_{20}$ straight-chain, branched-chain or cyclo alkyl or alkoxy; $R_1$, $R_2$ are unsubstituted, monosubstituted or polysubstituted functional group $Ar_1$ and said functional group $Ar_1$ is selected from hydrogen, halogen, cyano, substituted or unsubstituted $C_1$-$C_{40}$ straight-chain or branched-chain or cyclo alkyl, substituted or unsubstituted aryl or heteroaryl; $R_3$, $R_7$ are unsubstituted, monosubstituted or polysubstituted functional group $Ar_2$, and said functional group $Ar_2$ is selected from hydrogen, cyano, substituted or unsubstituted $C_1$-$C_{40}$ straight-chain or branched-chain or cyclo alkyl, substituted or unsubstituted $C_1$-$C_{40}$ alkoxy, substituted or unsubstituted $C_6$-$C_{40}$ aryl, substituted or unsubstituted $C_6$-$C_{40}$ aralkyl substituted or unsubstituted $C_6$-$C_{40}$ aryl alkoxy.

2. The copolymer comprising anthracene and benzoselenadiazole according to claim 1, wherein said $R_1$ and $R_2$ are the same functional group $Ar_1$, and said functional group $Ar_1$ is halogen, cyano, substituted or unsubstituted $C_1$-$C_{40}$ straight-chain or branched-chain or cyclo alkyl, substituted or unsubstituted aryl or heteroaryl.

3. The copolymer comprising anthracene and benzoselenadiazole according to claim 1, wherein said b is 1 or 2, $R_3$, $R_7$ are the same functional group $Ar_2$, and said functional group Ar₂ is selected from cyano, substituted or unsubstituted $C_1$-$C_{40}$ straight-chain or branched-chain or cyclo alkyl, substituted or unsubstituted $C_1$-$C_{40}$ alkoxy, substituted or unsubstituted $C_6$-$C_{40}$ aryl, substituted or unsubstituted $C_6$-$C_{40}$ aralkyl, substituted or unsubstituted $C_6$-$C_{40}$ aryl alkoxy.

4. The copolymer comprising anthracene and benzoselenadiazole according to claim 1, wherein n is an integer from 10 to 100.

5. The preparing method of copolymer comprising anthracene and benzoselenadiazole, comprising:

providing the compounds A and B represented by the following formula, respectively:

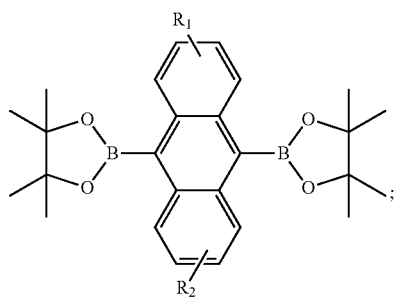
A

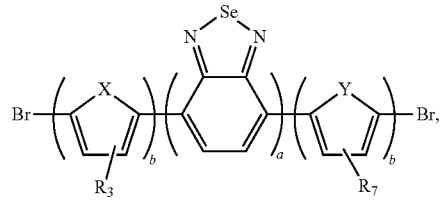
B wherein a is 1 or 2; b is 0,1 or 2; X, Y are Se or $SO_2$, N—$R_4$, $R_5$—Si—$R_6$; $R_4$, $R_5$, $R_6$ are selected from $C_1$-$C_{20}$ straight-chain, branched-chain or cyclo alkyl or alkoxy; $R_1$, $R_2$ are unsubstituted, monosubstituted or polysubstituted functional group $Ar_1$, and said functional group $Ar_1$ is selected from hydrogen, halogen, cyano, substituted or unsubstituted $C_1$-$C_{40}$ straight-chain or branched-chain or cyclo alkyl, substituted or unsubstituted aryl or heteroaryl; $R_3$, $R_7$ are unsubstituted, monosubstituted or polysubstituted functional group $Ar_2$, and said functional group $Ar_2$ is selected from hydrogen, cyano, substituted or unsubstituted $C_1$-$C_{40}$ straight-chain or branched-chain or cyclo alkyl, substituted or unsubstituted $C_1$-$C_{40}$ alkoxy, substituted or unsubstituted $C_6$-$C_{40}$ aryl, substituted or unsubstituted $C_6$-$C_{40}$ aralkyl, substituted or unsubstituted $C_6$-$C_{40}$ aryl alkoxy;

compound A and compound B were carried out in the presence of catalyst, alkaline solution and organic solvent and under oxygen-free environment, the polymerization: represented by following formula:

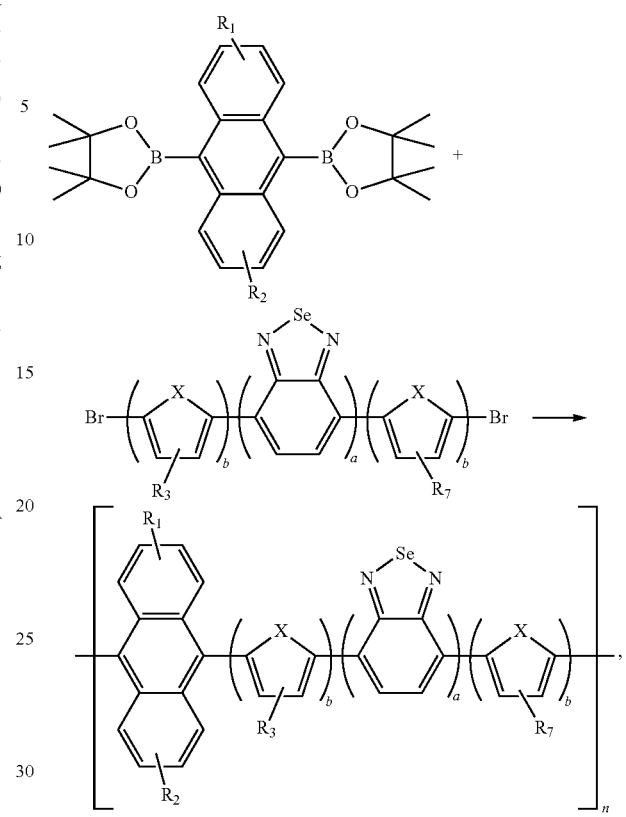

wherein n is a natural number from 10 to 1000, to produce said copolymer comprising anthracene and benzoselenadiazole.

6. The preparing method of copolymer comprising anthracene and benzoselenadiazole according to claim 5, wherein polymerization product is purified after being obtained, the purification is conducted as follows: dissolving polymerization product in chloroform, purifying by means of column chromatography on neutral aluminum oxide chromatographic column, removing catalyst, and then rotary evaporating polymerization product and chloroform solution, dripping methanol solvent and stirring for several hours, drying, extracting copolymer in Soxhlet extractor, obtaining copolymer comprising anthracene and benzoselenadiazole.

7. The preparing method of copolymer comprising anthracene and benzoselenadiazole according to claim 5, wherein the catalyst provided in said polymerization is organopalladium catalyst or mixture of organopalladium catalyst and organic phosphine ligands, of which the amount is equivalent to 0.5%-10% of the molar amount of compound A; the provided organic solvent is methylbenzene, tetrahydrofuran, glycol dimethyl ether, benzene or N, N-dimethyl formamide, said alkaline solution is metal hydroxide, aqueous solution of metal carbonate or aqueous solution of alkyl ammonium hydroxide, the amount of the alkaline solution is 5 to 10 times as much as the molar amount of compound A.

8. The preparing method of copolymer comprising anthracene and benzoselenadiazole according to claim 5, wherein the catalyst used in said polymerization is organopalladium catalyst or mixture of organopalladium catalyst and organic phosphine ligands, in said mixture the molar ratio of organopalladium catalyst to organic phosphine ligands is 1:2 to 20.

9. The preparing method of copolymer comprising anthracene and benzoselenadiazole according to claim 5, wherein the polymerization under the temperature in the range of 60° C. to 100° C. for 1 to 7 days.

10. A product which is polymer solar cell device, organic field effect transistors, organic light-emitting devices, organic optical storage devices or organic laser devices, said product comprises the copolymer comprising anthracene and benzoselenadiazole according to claim 1.

11. The solar cell device according to claim 10, further including glass base layer, transparent anode, middle auxiliary layer, active layer and cathode.

* * * * *